(12) United States Patent
Salvi (10) Patent No.: US 8,554,267 B2
(45) Date of Patent: Oct. 8, 2013

(54) BROADBAND INPUT FREQUENCY ADAPTIVE TECHNIQUE FOR FILTER TUNING AND QUADRATURE GENERATION

(75) Inventor: Raul Salvi, Boca Raton, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 737 days.

(21) Appl. No.: 12/647,476

(22) Filed: Dec. 26, 2009

(65) Prior Publication Data
US 2011/0159834 A1 Jun. 30, 2011

(51) Int. Cl.
*H04B 1/10* (2006.01)
*H04B 1/18* (2006.01)
*H04B 1/16* (2006.01)

(52) U.S. Cl.
USPC ......... 455/550.1; 455/290; 455/307; 455/339

(58) Field of Classification Search
USPC ........... 455/67.11, 296, 307, 226.1, 283, 286, 455/290, 339, 77, 550.1; 375/343, 350
See application file for complete search history.

(56) References Cited

U.S. PATENT DOCUMENTS

| | | | |
|---|---|---|---|
| 5,341,107 A * | 8/1994 | Bijker et al. | 329/337 |
| 5,949,832 A * | 9/1999 | Liebetreu et al. | 375/344 |
| 6,441,682 B1 | 8/2002 | Vinn et al. | |
| 6,985,710 B1 | 1/2006 | Margairaz et al. | |
| 6,987,966 B1 * | 1/2006 | Wu et al. | 455/420 |
| 7,184,740 B2 * | 2/2007 | Kim | 455/324 |
| 7,245,178 B2 * | 7/2007 | Kitano | 327/553 |
| 7,400,868 B2 * | 7/2008 | Fukusen et al. | 455/150.1 |
| 7,405,613 B2 * | 7/2008 | De Ruijter | 329/339 |
| 7,587,010 B2 * | 9/2009 | Morie et al. | 375/350 |
| 7,761,067 B1 * | 7/2010 | Tsai et al. | 455/127.2 |
| 2003/0117201 A1 * | 6/2003 | Wang | 327/254 |
| 2004/0002323 A1 * | 1/2004 | Zheng | 455/324 |
| 2004/0137869 A1 * | 7/2004 | Kim | 455/324 |
| 2007/0077908 A1 * | 4/2007 | Vorenkamp et al. | 455/323 |
| 2008/0013656 A1 * | 1/2008 | Van Sinderen et al. | 375/346 |
| 2008/0132191 A1 * | 6/2008 | Quinlan et al. | 455/302 |
| 2008/0191795 A1 * | 8/2008 | Dharmalinggam et al. | 327/553 |
| 2009/0068958 A1 * | 3/2009 | Nakamura | 455/67.16 |
| 2010/0173598 A1 * | 7/2010 | Kavadias et al. | 455/226.1 |
| 2010/0178890 A1 * | 7/2010 | Fujii et al. | 455/209 |
| 2011/0019785 A1 * | 1/2011 | Cowley et al. | 375/350 |
| 2011/0086605 A1 * | 4/2011 | Chanca et al. | 455/302 |
| 2011/0312292 A1 * | 12/2011 | Mo et al. | 455/226.1 |

OTHER PUBLICATIONS

Tillman, et al., "A Polyphase Filter based on CMOS Inverters," 23rd NORCHIP Conference, 2005, Nov. 21-22, 2005, pp. 12-15.
Wang, et al., "A 5-GHz I/Q Clock Generator Using a Self-Calibrated Technique," European Solid-State Circuits Conference, 2002, pp. 807-810.
Sanderson, et al., "5-6 GHz SiGe VCO with Tunable Polyphase Output for Analog Image Rejection and I/Q-Mismatch Compensation," 2003 IEEE Radio Frequency Integrated Circuits Symposium, Jun. 8-10, 2003, pp. 683-686.

* cited by examiner

*Primary Examiner* — Simon Nguyen
(74) *Attorney, Agent, or Firm* — Anthony P. Curtis; Daniel R. Bestor (57) ABSTRACT

A method for tuning a filter is provided. The amplitude of a first signal ($I_1$) is compared with the amplitude of a comparison signal. The first signal is generated with a first filter, which receives a first input signal, and there is a phase difference between the first signal ($I_1$) and the comparison signal. A tuning signal is then generated based on differences between the amplitudes of the first signal ($I_1$) and the comparison signal. The tuning signal compensates for any phase and/or amplitude offset in the first signal ($I_1$).

14 Claims, 5 Drawing Sheets

FIG. 5

BROADBAND INPUT FREQUENCY ADAPTIVE TECHNIQUE FOR FILTER TUNING AND QUADRATURE GENERATION

FIELD OF THE INVENTION

The present invention relates generally to a technique for filter tuning. In particular, the invention relates to a broadband input frequency adaptive technique for filter tuning and/or quadrature generation.

BACKGROUND

Signal quadrature is used to generate signals (known as quadrature signals) with four different phases (for example, 0°, 90°, 180°, and 270°) from a single or differential input into a filter, where the input signal has a set frequency and set amplitude. Signal quadrature is an important function for modern radio modulators and demodulators and is used in modern transceiver signal processing systems. When using signal quadrature, the accuracy of the phase angles as well as the bandwidth accuracy of the quadrature signals generated from the input signal is critical and directly correlates with the ability to accurately send and detect quadrature information laden signals.

One way to generate quadrature signals is by using a polyphase filter, and more specifically, a quadrature generator. The quadrature generator consists of a simple ring of capacitor and resistor pairs in which four symmetrical points in the ring are tapped in order to obtain quadrature signals having four phases (for example, 0°, 90°, 180°, and 270°) of an input signal. The resistor and capacitor values are chosen such that the corner frequencies of the quadrature generator coincide with the frequency of the input signal used to generate the quadrature signals from. The response of the quadrature generator is inherently narrowband with quadrature phase accuracy and amplitude mismatch degrading as the input frequency departs from the capacitor and resistor pairs' corner frequencies. Cascading several rings with staggered corners tends to broaden the bandwidth capability of a device, but generally this may result in higher costs, more area used, a larger current drain, higher noise and more signal loss. Even with cascading multiple rings, it is difficult to maintain quadrature accuracy over one octave of bandwidth.

In typical direct conversion and direct launch transceiver systems, obtaining good bandwidth match between a pair of channels can also be challenging. Tracking circuits do well to shift some of the absolute bandwidth errors, but are unable to correct out differences between two matched filter responses.

As a result, it would be desirable to provide a method of tuning a filter or a pair of filters to correct for any mismatches in phase angle, amplitude, and corner frequency in a signal, such as a quadrature signal. Additionally, it would be desirable to provide a method of tuning a pair of filters so that the signals generated by the pair of filters have accurate phase angles.

SUMMARY

In one aspect, a method for tuning filters is provided. The method includes but is not limited to generating a first signal ($I_1$) at a first frequency with a first filter and a second signal ($Q_1$) at a second frequency with a second filter. The first signal ($I_1$) has a first amplitude and the second signal ($Q_1$) has a second amplitude. The first and second filters are matched filters. The first and second signals ($I_1$), ($Q_1$) are generated from an input signal having an input frequency. The method also includes but is not limited to sending the first and second signals ($I_1$), ($Q_1$) from the first and second filters to a tuning device and comparing the first amplitude with the second amplitude. Additionally, the method includes but is not limited to generating first and second tuning signals based on differences between the first and second amplitudes, and tuning the first and second filters using the first and second tuning signals, respectively.

In another aspect, an electronic device which receives and processes signals is provided. The electronic device includes but is not limited to a first tunable filter and a filter tuning device. The first tunable filter receives a first input signal ($In_1$) and outputs a first signal ($I_1$). The filter tuning device is connected with the first tunable filter. The filter tuning device receives the first signal ($I_1$) along with a comparison signal, measures amplitudes of the first signal ($I_1$) and the comparison signal, and then generates a tuning signal received by the first tunable filter. The tuning signal is based upon the amount of amplitude offset between the first signal ($I_1$) and the comparison signal. The tuning signal corrects for phase and/or amplitude offsets in the first signal ($I_1$).

In another aspect, a method for tuning a filter is provided. The method includes but is not limited to comparing a first amplitude of a first signal ($I_1$) with a second amplitude of a comparison signal. The first signal is generated with a first filter receiving a first input signal and there is a phase difference between the first signal ($I_1$) and the comparison signal. The method also includes but is not limited to generating a tuning signal based on differences between the first and second amplitudes. The tuning signal compensates for any phase and/or amplitude offsets in the first signal ($I_1$).

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

The present invention makes use of the discovery that by examining the amplitudes of a signal, any phase offset in the signal can then be corrected by tuning the filter used to generate the signal. As a result, since the amplitudes of a signal can be easily determined for high bandwidth signals, such as by using a single-ended or differential envelope comparator, then the phase of the signal can be adjusted by tuning the filter used to generate the signal.

In the description that follows, the subject matter of the application will be described with reference to acts and symbolic representations of operations that are performed by one or more electronic devices, unless indicated otherwise. However, although the subject matter of the application is being described in the foregoing context, it is not meant to be limiting as those skilled in the art will appreciate that some of the acts and operations described hereinafter can also be implemented in hardware, software, and/or firmware and/or some combination thereof.

Figure 1:
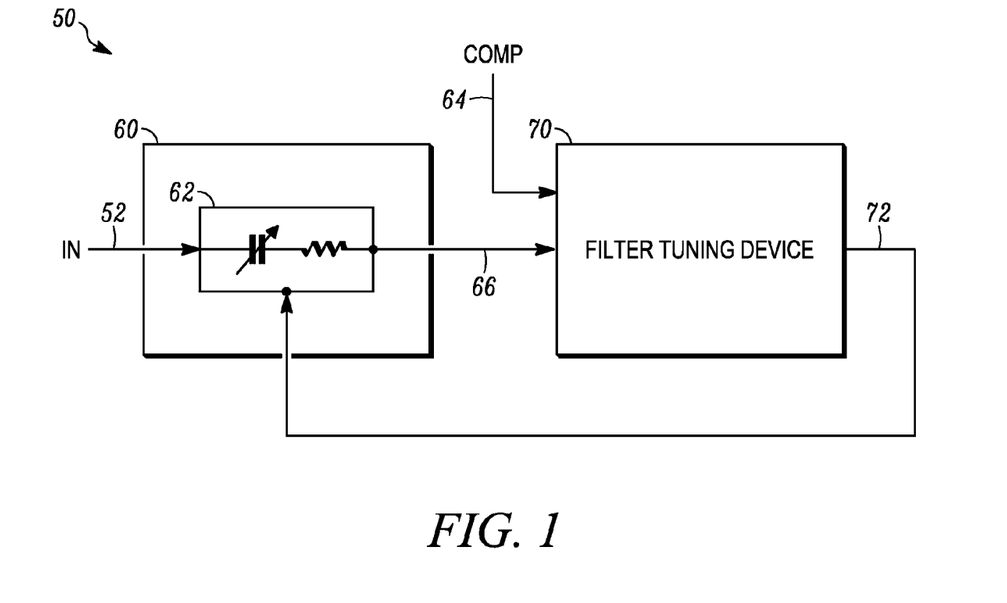
FIG. 1 depicts a schematic representation of an electronic device with a filter, in accordance with one embodiment of the present invention.

With reference to FIG. 1, depicted is an electronic device 50 having a filter 60 connected with a filter tuning device 70. The electronic device 50 is any electronic device which can receive and process signals, and includes things such as an integrated circuit, a semiconductor chip, a radio, a transmitter for transmitting wired or wireless signals, a receiver for receiving wired or wireless signals, a telephone, a cellular phone, a walkie-talkie, a wireless 802.11 a/b/g/n device, a Bluetooth device, a computer, a notebook, a tablet computer, or the like.

Filter 60 is any filter which receives an input signal 52 and then alters a characteristic of the input signal 52, such as the phase, frequency or amplitude of the input signal 52 and outputs an output signal 66 as a result. Preferably, the output signal 66 is at substantially the same frequency as the input signal, but at a different phase and/or amplitude from that of the input signal 52. As used herein, having substantial the same frequency is a frequency that is preferably within 10%, and more preferably within 1%, and most preferably within 0.1% of the frequency of the input signal 52. Preferably, the input signal 52 is a broadband signal having a frequency of 1 MHz or greater, and preferably a frequency of 1 GHz or greater, and most preferably a frequency of 1 GHz to 10 GHz. Filter 60 is tunable in that the characteristics of the output signal 66 may vary for a given input signal 52 but altering properties of the filter 60, such as resistance and capacitance. Preferably, filter 60 includes components 62, such as a resistor, a capacitor, an inductor, and/or any other resonant element, wherein at least one of the components 62 are tunable, that is, having a resistance, capacitance, or inductance, which can be varied. Preferably, the resistance or capacitance can be varied with by sending a signal of a particular voltage to the respective variable resistor or capacitor. For example a variable capacitor can either increase or decrease its capacitance and a variable resistor can either increase or decrease its resistance. Referring to FIG. 1, in one embodiment, the components 62 of filter 60 include a tunable capacitor. In one embodiment, filter 60 includes components 62 which make up one filter, as shown in FIG. 1. In one embodiment, filter 60 includes components 62 which make up multiple filters, preferably all of which are matched filters. As used herein, matched filters are a pair or more of filters which for a given input signal are designed to generate output signals with the same frequency and amplitude, but possibly having different phases. Matched filters preferably use the same components, such as the same resistors or the same capacitors, however due to variance in the construction of those components, matched filters do not always generate output signals with same phase, frequency, and/or amplitude response.

Filter 60 generates output signal 66 from input signal 52, upon running input signal 52 through components 62. Often, components 62 are designed to operate within certain tolerances, and therefore their properties, such as resistance, capacitance, or inductance, vary either due to manufacturing defects or temperature changes. This variance cause the filter 60 not to perform as designed and generate an output signal 66 having characteristics such as frequency, amplitude and phase, whose values vary from their desired values. Additionally, the frequency of the input signal 52 may also vary outside of the designed operating range of filter 60, causing the filter 60 not to perform as designed. As a result, in order for the filter 60 to perform more closely to the way it was designed, having an output signal with characteristics having values within 1%, and preferably, within 0.01%, and more preferably, within 0.001% of their desired values, the output signal 66 is sent to a filter tuning device 70.

Filter tuning device 70 is connected with the filter 60 and receives the output signal 66 along with a comparison signal 64, and then generates a tuning signal 72 received by the filter 60 in order to compensate for any variations between the actual values of characteristics of the output signal 60 and their intended values. In order to do this, the filter tuning device 70 determines the value of an amplitude of the output signal 66 and compares it with a value of an amplitude of comparison signal 64 at a given frequency. The tuning signal 72 is based upon the amount of amplitude offset between the output signal 66 and the comparison signal 64. The tuning signal 72 corrects for one characteristic which is off from a desired characteristic, such as amplitude, frequency, or phase. In one embodiment, the tuning signal 72 corrects for phase offsets present in the output signal 66. In one embodiment the tuning signal corrects for and adjusts a corner frequency of the output signal 66 so that the corner frequency of the output signal 66 coincides with and matches a corner frequency of the comparison signal 64. A signal's corner frequency is a boundary in a signal's frequency response at which the signal begins to be reduced, attenuated, or reflected, rather than simply passing through the electronic device 50 or a component of the electronic device 50, such as filter 60.

The comparison signal 64 can be any signal used to compare output signal 66 against, and can include a reference signal or a signal which has a desired characteristic. In one embodiment, the one or more values of the characteristics of the comparison signal 64 are at the desired values. In this embodiment, the amplitude of the output signal 66 is compared to that of the comparison signal 64 and adjusted to match the amplitude of the of the comparison signal 64, preferably within 10%, and more preferably within 1%, and more preferably within 0.01%, and more preferable within 0.001% of the value of the amplitude of the comparison signal 64. In this embodiment, the comparison signal may be the input signal 52.

In one embodiment, the one or more values of the characteristics of the output signal 66 are not at the desired values. In this embodiment, the amplitude of the output signal 66 is compared to that of the comparison signal 64 and adjusted to be at an average value of the amplitude of the comparison signal 64 and that of the output signal 66, preferably within 10%, and more preferably within 1%, and more preferably within 0.01%, and more preferable within 0.001% of an average value of the amplitude of the comparison signal 64 and the amplitude of the output signal 66. In this embodiment, the comparison signal may be a second signal output signal output from a second filter.

Both the comparison signal 64 and the output signal 66 are input into the filter tuning device 70, which determines the amplitudes of both the output signal 66 and the comparison signal 64, determines the difference in amplitude between the output signal 66 and the comparison signal 64, and then generates a tuning signal 72 which is transmitted to the filter 60 in order to tune the filter 60 and adjust the at least one characteristic of the output signal 66.

The tuning signal 72 is based upon the amount of amplitude offset, or difference in amplitude, between the output signal 66 and the comparison signal 64. Preferably, the tuning signal 72 corrects for a phase offset in the output signal 66 by tuning one of the components 62, such as a variable capacitor, a variable resistor, a variable inductor, and/or any other resonant device. Upon tuning the filter 60, an amplitude of the output signal 66 is compared again to an amplitude of the comparison signal 64, and if there is a difference, preferably a difference greater than 1%, preferably greater than 0.01%, and more preferably greater than 0.001%, between the two amplitudes, another tuning signal 72 is generated by the filter tuning device 70 and then sent to the filter 60 in order to tune a component 62 of filter 60 to result in an output signal 66 having a characteristic which is more closely matched to a desired characteristic for output signal 66. In this manner, by using a filter tuning device 70 which monitors an amplitude of output signal 66 output from the filter 60, a characteristic of output signal 66, such as phase, frequency or amplitude, can be adjusted by generating a tuning signal 72 and sending that tuning signal 72 to the filter 60. Thus the filter 60 is able to adapt to different signal conditions based on its relative characteristics to a comparison signal 64 or a signal which has a desired characteristic.

Filter tuning device 70 comprises any device or combination of devices which can monitor and determine an amplitude of output signal 66 and then generate another signal, such as a tuning signal 72, which can be used to vary properties of and tune filter 60. In one embodiment, the filter tuning device 70 includes an envelope comparator, such as a single-ended or differential envelope comparator, which can determine an amplitude of a signal and determine if that amplitude is beyond a certain range. In one embodiment, the filter tuning device 70 includes a voltage tuning device which can generate an analog signal having a predetermined voltage which may be sent to filter 60 in order to tune filter 60. In one embodiment, the filter tuning device 70 includes an analog-to-digital (A/D) convertor, a digital signal processor, and a digital-to-analog (D/A) convertor. The A/D convertor receives the output signal 66 and converts it to digital form, and the digital signal processor then analyzes the digital form of output signal 66 and determines an amplitude of the output signal 66. Then, once the amplitude is determined and compared with that of the amplitude of the comparison signal 64, then tuning signal 72 is generated by the D/A convertor from instructions received by the digital signal processor.

In one embodiment, the filter tuning device 70 does not receive or monitor comparison signal 64 and determine an amplitude of comparison signal 64. In this embodiment, a predetermined value for a desired amplitude of a signal is preprogrammed into the filter tuning device 70, and the filter tuning device 70 determines an amplitude of the output signal 66 which is then compared to that of the predetermined value, and tuning signal 72 is generated as a result.

Figure 2:
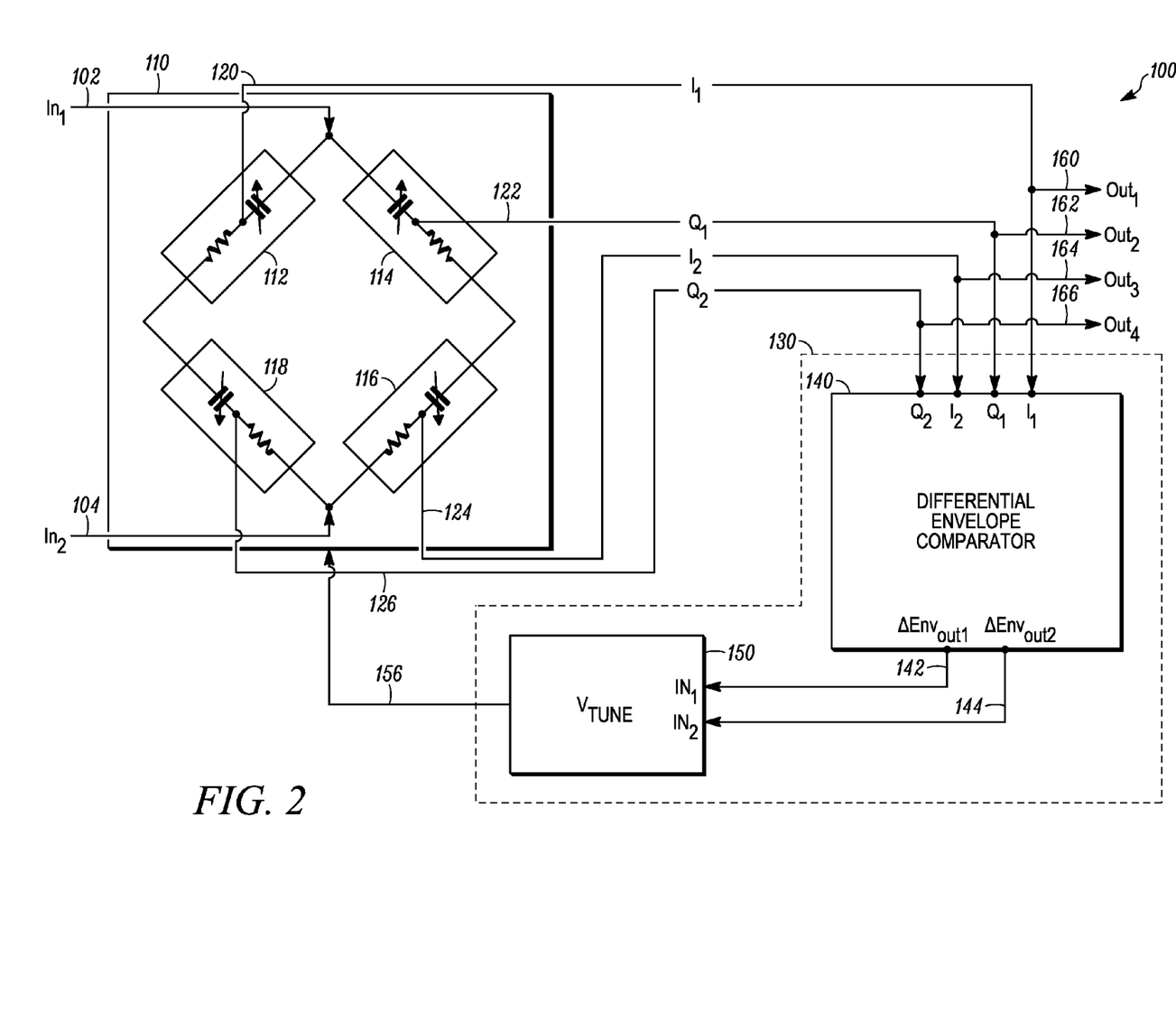
FIG. 2 depicts a schematic representation of an electronic device with a frequency adaptable polyphase filter, in accordance with one embodiment of the present invention.

With reference to FIG. 2, depicted is an electronic device 100 having a frequency adaptable polyphase filter 110 connected with a filter tuning device 130. The electronic device 100 is any electronic device which can receive and process signals, and includes things such as an integrated circuit, a semiconductor chip, a radio, a transmitter, a receiver, a telephone, a cellular phone, a walkie-talkie, a wireless 802.11 a/b/g/n device, a Bluetooth device, a computer, a notebook, a tablet computer, or the like.

Polyphase filter 110 is any filter which splits an input signal into a given number of phase equidistant signals. Preferably, in one embodiment, the polyphase filter 110 is a quadrature filter which generates four sub-band signals 120, 122, 124, 126 from two input signals 102, 104. In this embodiment, the polyphase filter 110 receives a first input signal ($In_1$) 102 and a second input signal ($In_2$) 104 and then generates sub-band signals 120, 122, 124, 126 from the input signals 102, 104, wherein the sub-band signals 120, 122, 124, 126 are intended to have the same frequency as the input signals 102, 104, but each sub-band signal 120, 122, 124, 126 is at a different phase from the input signals 102, 104. The polyphase filter 110 comprises four tunable filters, a first tunable filter 112, a second tunable filter 114, a third tunable filter 116, and a fourth tunable filter 118 all connected with each other and forming a ring, as shown in FIG. 2.

The first input signal ($In_1$) 102 is received by the inputs of both the first and second tunable filters 112, 114, while the second input signal ($In_2$) 104 is received by the inputs of both the third and fourth tunable filters 116, 118. The first tunable filter 112 generates and outputs first signal ($I_1$) from the first input signal ($In_1$) 102, while the second tunable filter 114 generates and outputs second signal ($Q_1$) from the first input signal ($In_1$) 102. The third tunable filter 116 generates and outputs third signal ($I_2$) from the second input signal ($In_2$) 104, while the fourth tunable filter 118 generates and outputs fourth signal ($Q_2$) from the second input signal ($In_2$) 104.

The phases of sub-band signals 120, 122, 124, 126 are each offset from one another by a pre-set amount, preferably, an equidistant amount. For example, in one embodiment, the phases of sub-band signals 120, 122, 124, 126 are each offset by ninety degrees.

Each tunable filter 112, 114, 116, 118, preferably includes a resistor, a capacitor, an inductor, and/or any resonant element, wherein at least one of the resistor, the capacitor, the inductor, or the resonant element, is variable. Preferably, the resistance, capacitance, or inductance can be varied by sending a signal of a particular voltage to the respective variable resistor, capacitor, inductor, or resonant element. For example a variable capacitor can either increase or decrease its capacitance and a variable resistor can either increase or decrease its resistance depending on the voltage of a signal received by that particular capacitor or resistor. Referring to FIG. 2, the tunable filters 112, 114, 116, 118 each preferably include a tunable capacitor. The manner in which the characteristic of such components vary is well known and thus will not be described in detail herein.

The filter tuning device 130 is connected with the polyphase filter 110 and receives signals 120, 122, 124, 126, generated by the polyphase filter 110, and then generates a tuning signal 156 received by the tunable filters 112, 114, 116, 118 in order to compensate for any variations between the actual values of characteristics of the output signals 120, 122, 124, 126 and their intended values. In one embodiment, four tuning signals are generated by the filter tuning device 130, wherein each tuning signal is sent to one of the tunable filters 112, 114, 116, 118.

In order to generate a tuning signal 156, the filter tuning device 130 determines the value of an amplitude of the first signal ($I_1$) 120 and compares it with a value of an amplitude of the second signal ($Q_1$) 122. The filter tuning device 130 also determines the value of an amplitude of the third signal ($I_2$) 124 and compares it with a value of an amplitude of the fourth signal ($Q_2$) 126. The tuning signal 156, which in this case comprises multiple tuning signals, preferably one for each filter, is based upon the amount of amplitude offset between the first signal ($I_1$) 120 and the second signal ($Q_1$) 122, and the amplitude offset between the third signal ($I_2$) 124 and the fourth signal ($Q_2$) 126. The tuning signal 156 corrects for one characteristic which is off from a desired characteristic, such as amplitude, frequency, or phase. In one embodiment, the tuning signal 156 corrects for phase offsets present in the signals 120, 122, 124, 126.

Since it is possible that one or both the first and second signals 120, 122 or one or both of the third and fourth signals 124, 126, have at least one characteristic which is off from a desired characteristic, the amplitudes of the first and second signals 120, 122 and the third and fourth signals 124, 126 are adjusted to be at an average value of the amplitudes of the first and second signals 120, 122 and the third and fourth signals 124, 126, preferably within 10%, and more preferably within 1%, and more preferably within 0.01%, and more preferable within 0.001% of an average value of the amplitudes of signals 120, 122 and signals 124, 126.

Signals 120, 122, 124, 126 are input into the filter tuning device 130, which determines the amplitudes of signals 120, 122, 124, 126, determines the difference in amplitude between signals 120 and 122 and between signals 124 and 126, and then generates a tuning signal 156 which is transmitted to the polyphase filter 110, and preferably filters 112, 114, 116, and 118 in order to tune the polyphase filter 110 and adjust at least one characteristic of signals 120, 122, 124, 126.

The tuning signal 156 is based upon the amount of amplitude offset, or difference in amplitude, between signals 120 and 122 and between signals 124 and 126. Preferably, the tuning signal 156 corrects for a phase offset in signals 120, 122, 124, 126 by tuning a component of filters 112, 114, 116, and 118, such as a variable capacitor or a variable resistor. Upon tuning the filters 112, 114, 116, and 118, an amplitude of each signal 120 and 126 is compared again to an amplitude of each signal 122 and 124, respectively, and if there is a difference, preferably a difference greater than 1%, preferably greater than 0.01%, and more preferably greater than 0.001%, between the two amplitudes, another tuning signal 156 is generated by the filter tuning device 130 and then sent to the polyphase filter 110 in order to tune a component of filters 112, 114, 116, and 118, so that an amplitude of each signal 120, 122, 124, and 126 is either increased or reduced in order to result in signals 120, 122, 124, and 126 having a characteristic which is more closely matched to a desired characteristic for each signal 120, 122, 124, and 126.

In this manner, by using a filter tuning device 130 which monitors an amplitude of signals 120, 122, 124, and 126 output from the polyphase filter 110, a characteristic of each signal 120, 122, 124, and 126, such as phase, frequency or amplitude, can be adjusted by generating a tuning signal 156 and sending that tuning signal 156 to polyphase filter 110. Furthermore, using the above discussed method of feedback control, electronic devices 50, 100 can automatically adapt to changes in the frequency, amplitude and phase of signals input into the polyphase filter 110 or to any component mismatches present in the polyphase filter 110, in order to insure adequate phase and amplitude balance over a wide range of frequencies and signal component conditions.

Filter tuning device 130 comprises any device or combination of devices which can monitor and determine an amplitude of output signals 120, 122, 124, and 126 and then generate another signal, such as a tuning signal 156, which can be used to vary properties of and tune polyphase filter 110. In one embodiment, the filter tuning device 130 includes an envelope comparator, preferably a differential envelope comparator 140, which can determine an amplitude of a signal and determine if that amplitude is beyond a certain range by comparing it with a comparison signal. The comparison signal may be another one of the signals 120, 122, 124, and 126, a reference signal, or a signal which has a desired characteristic. The filter tuning device 130 also includes a voltage tuning device 150 which can generate an analog signal having a predetermined voltage which may be sent to polyphase filter 110 in order to tune polyphase filter 110. The differential envelope comparator 140 is connected with the voltage tuning device 150 and generates a first different envelope output signal 142 from the differences in amplitude between the first and second signals 120, 122, and generates a second different envelope output signal 144 from the differences in amplitude between the third and fourth signals 124, 126. The differential envelope output signals 142, 144 are then used by the voltage tuning device 150 to generate a tuning signal 156, and preferably multiple tuning signals, which is then sent to polyphase filter 110, and preferably to each filter 112, 114, 116, and 118, to tune those respective filters and to correct for things such as component mismatches.

In one embodiment, filter tuning device 130 may include multiple differential envelope comparators, one for each signal 120, 122, 124, and 126 output by the polyphase filter 110, wherein each differential envelope comparator is used to compare each signal 120, 122, 124, and 126 to a comparison signal. The comparison signal may be another one of the signals 120, 122, 124, and 126, a reference signal, or a signal which has a desired characteristic.

Figure 3:
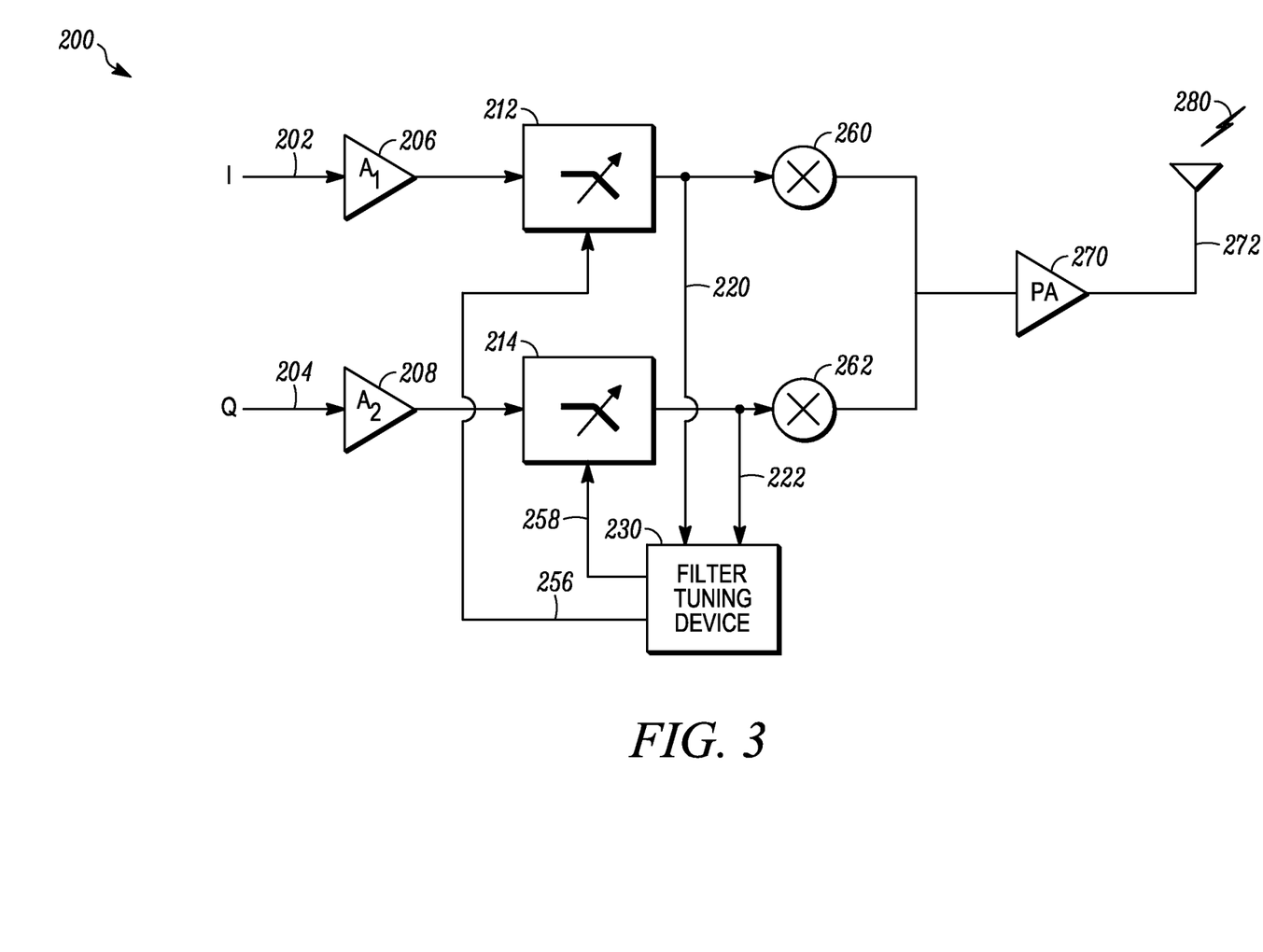
FIG. 3 depicts a schematic representation of a transmitter having both I and Q channels, in accordance with one embodiment of the present invention.

With reference to FIG. 3, depicted is a transmitter 200 for transmitting wireless signals 280 having a pair of filters 212, 214 connected with a filter tuning device 230.

Filter 212 receives a first input signal (I) 202 from first amplifier 206 and second filter 214 receives a second input signal (Q) 204 from second amplifier 208. Upon receiving first and second input signals 202, 204, the first filter 212 generates a first output signal 220 and the second filter 214 generates a second output signal 216, portions of which are routed to and received by the filter tuning device 230, as shown in FIG. 3. The remainder of the first and second output signals 220, 222, then get routed to first and second mixers 260, 262, respectively, and then combined into a single signal which gets amplified with power amplifier 270 and then transmitted with antenna 272 as wireless signal 280.

Each filter 212, 214, is preferably tunable and preferably includes a resistor, a capacitor, an inductor, and/or any other resonant element, wherein at least one of the resistor, the capacitor, the inductor, or the resonant element are variable, that is, the having a resistance, a capacitance, or inductance, which can be varied. The filter tuning device 230 is connected with the filters 212, 214 and receives signals 220, 222, generated by the filters 212, 214, and then generates tuning signals 256, 258 received by the filters 212, 214, in order to compensate for any variations between the actual values of characteristics of the output signals 220, 222, and their intended values. In order to do this, the filter tuning device 230 determines the value of an amplitude of the first output signal 220 and compares it with a value of an amplitude of the second output signal 222. Tuning signals 256, 258 are based upon the amount of amplitude offset between the first output signal 220 and the second output signal 222. The tuning signals 256, 258 correct for at least one characteristic which is off from a desired characteristic, such as amplitude, frequency, or phase. In one embodiment, the tuning signals 256, 258 correct for phase offsets present in the signals 220, 222. In this manner, the transmitter 200 is able to transmit signals 202, 204 with more accuracy since the filters 212, 214, are adjusted using tuning signals 256, 258 to output more accurate signals 220, 222.

Figure 4:
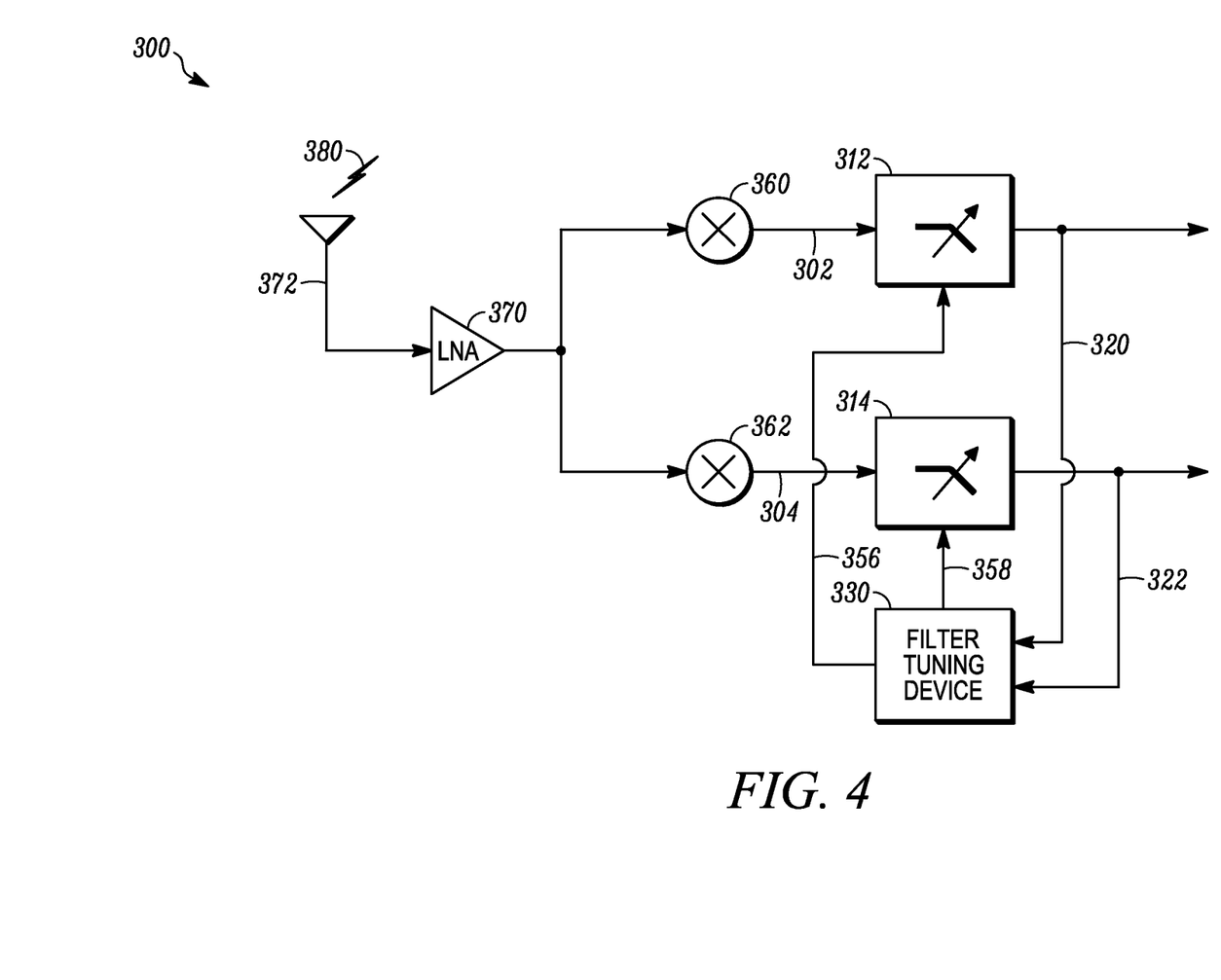
FIG. 4 depicts a schematic representation of a receiver having both I and Q channels, in accordance with one embodiment of the present invention.

With reference to FIG. 4, depicted is a receiver 300 for receiving wireless signals 380 having a pair of filters 312, 314 connected with a filter tuning device 330.

Wireless signals 380 are receiving via antenna 372 and then sent to a low noise amplifier 370 which amplifies the received signals and then outputs signals received by both mixers 360, 362. Filter 312 receives a first input signal (I) 302 from first mixer 360 and second filter 314 receives a second input signal (Q) 304 from second mixer 362. Upon receiving first and second input signals 302, 304, the first filter 312 generates a first output signal 320 and the second filter 314 generates a second output signal 316, portions of which are routed to and received by the filter tuning device 330, as shown in FIG. 4. The remainders of the first and second output signals 320, 322 are then routed to additional circuitry which is not shown.

Each filter 312, 314, is preferably tunable and preferably includes a resistor, a capacitor, an inductor, and/or any other resonant element, wherein at least one of the resistor, the capacitor, the inductor, or the resonant element are variable. The filter tuning device 330 is connected with the filters 312, 314 and receives signals 320, 322, generated by the filters 312, 314, and then generates tuning signals 356, 358 received by the filters 312, 314, in order to compensate for any variations between the actual values of characteristics of the output signals 320, 322, and their intended values. In order to do this, the filter tuning device 330 determines the value of an amplitude of the first output signal 320 and compares it with a value of an amplitude of the second output signal 322. Tuning signals 356, 358 are based upon the amount of amplitude offset between the first output signal 320 and the second output signal 322. The tuning signals 356, 358 correct for at least one characteristic which is off from a desired characteristic, such as amplitude, frequency, or phase. In one embodiment, the tuning signals 356, 358 correct for phase offsets present in the signals 320, 322. In this manner, the receiver 300 is able to receive and process signals 302, 304 with more accuracy since the filters 312, 314, are adjusted using tuning signals 356, 358 to output more accurate signals 320, 322.

Figure 5:
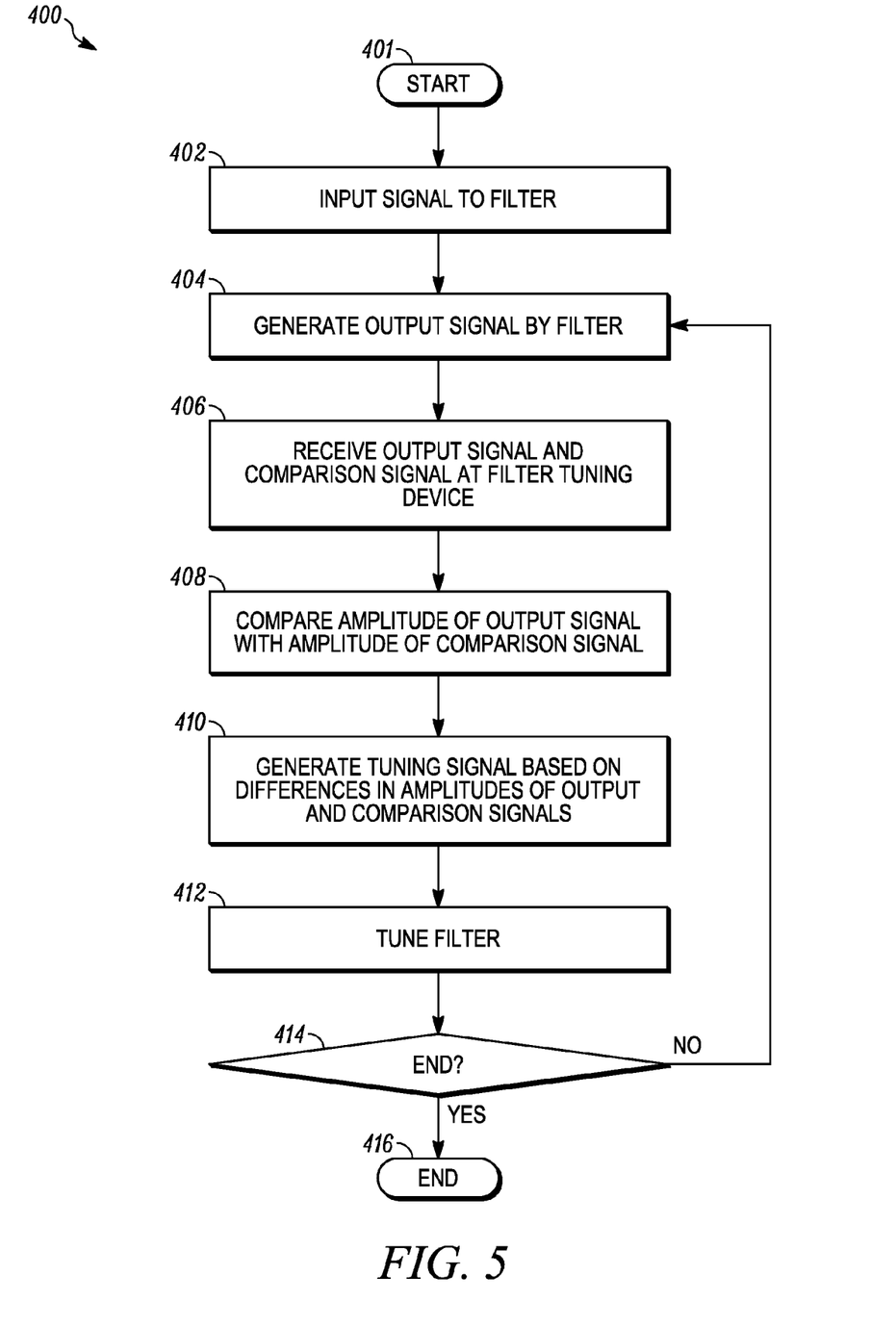
FIG. 5 depicts a flowchart illustration of methods, apparatus (systems) and computer program products, in accordance with one embodiment of the present invention.

FIG. 5 provides a method 400 for tuning a filter 60. Method 400 may occur in real-time or during a training session. At block 401, the method 400 is initiated with a start operation. At block 402, an input signal 52 is sent to and received by the filter 60. Moving to block 404, upon receiving the input signal 52, the filter 60 then generates an output signal 66, which preferably has substantially the same frequency as the input signal 52, but a different phase and/or amplitude. At block 406, the output signal 66 along with a comparison signal 64 are received at filter tuning device 70, whereby the amplitudes of both the output signal 66 and the comparison signal 64 are determined and compared to each other, as shown in block 408, in order to determine any characteristics, such as phase or amplitude, which are off in the output signal 66.

Moving to block 410, a tuning signal 72, based on differences in the amplitudes of the output signal 66 and the comparison signal 64, is then generated by the filter tuning device 70. The tuning signal 72 is then received by filter 60 and the filter 60 is tuned at block 412. Upon tuning the filter 60, the method 400 decides at block 414 whether to terminate or again receive an input signal and accordingly either ends at block 416 or moves back to block 404, as shown in FIG. 5.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.)

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into comprehensive devices and/or processes and/or systems via a reasonable amount of experimentation. Those having skill in the art will recognize that examples of such comprehensive devices and/or processes and/or systems might include—as appropriate to context and application—all or part of devices and/or processes and/or systems of (a) an air conveyance (e.g., an airplane, rocket, hovercraft, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Quest, Southwestern Bell, etc.); or (g) a wired/wireless services entity such as Sprint, Cingular, Nextel, etc.), etc.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. Accordingly, the invention is not to be restricted except in light of the appended claims and their equivalents.

The invention claimed is:

1. A method for phase tuning filters in a quadrature signal generator of an electronic device, the method comprising:
    generating, via a tunable polyphase quadrature ring filter, from first and second input signals having an input frequency, first and second filtered in-phase signals at substantially the input frequency and third and fourth filtered quadrature signals at substantially the input frequency, the first and third filtered in-phase and quadrature signals respectively having first and third amplitudes and a phase offset between one another and the second and fourth filtered in-phase and quadrature signals respectively having second and fourth amplitudes and a second phase offset between one another;
    outputting the first, second, third, and fourth filtered signals from the polyphase quadrature ring filter to a comparator and to additional circuitry of the electronic device;
    comparing, via the comparator, the first and third amplitudes of the first and third filtered in-phase and quadrature signals and determining a difference between the first and third amplitudes and comparing the second and fourth amplitudes of the second and fourth filtered in-phase and quadrature signals and determining a second difference between the second and fourth amplitudes;
    generating separate first and second phase tuning signals having values that are a function of the first and second determined differences; and
    tuning the tunable polyphase quadrature ring filter using the first and second phase tuning signals so as to adjust a phase of one or more of the first, second, third, and fourth filtered signals as a function of one or both of the first and second phase tuning signals.

2. The method of claim 1, wherein the comparing is performed using either a single-ended envelope comparator or a differential envelope comparator.

3. The method of claim 1, wherein the generation of the first and second tuning signals is performed using a voltage tuning device that is electrically coupled to the tunable polyphase quadrature ring filter, wherein the voltage tuning device generates the first and second phase tuning signals at determined voltages and provides them to the tunable polyphase quadrature ring filter in order to tune the tunable polyphase quadrature ring filter.

4. The method of claim 1, wherein the tuning of the tunable polyphase quadrature ring filter adjusts first and second corner frequencies for the first and second filtered signals, respectively, so that the first and second corner frequencies coincide with and match each other and the input frequency of the input signal.

5. The method of claim 1, wherein the first and second filters are matched filters.

6. The method of claim 1, wherein the input frequency in the range of between 1 and 10 GHz.

7. The method of claim 1, wherein the steps of generating and tuning are executed response to the comparing step finding a difference of greater than .01% between the first and second amplitudes.

8. The method of claim 1, wherein the input frequency is greater than 1 Ghz.

9. An electronic device receiver that receives and processes wireless signals, the receiver comprising:
    an antenna for receiving a wireless signal and providing a received signal at a first frequency;
    a first tunable filter that receives an in-phase signal portion of the received signal at the first frequency and outputs a first filtered signal, having a same frequency as the in-phase signal portion of the received signal, to a filter tuning device and to additional circuitry of the electronic device;
    a second tunable filter that receives a quadrature signal portion of the received signal at the first frequency and outputs a second filtered signal, having a same frequency as the quadrature signal portion of the received signal, to the filter tuning device and to additional circuitry of the electronic device; and
    the filter tuning device connected with the first and second tunable filters, the filter tuning device receiving the first filtered signal and the second filtered signal, measuring first and second amplitudes of the first and second filtered in-phase and quadrature signal portions and determining a difference between the first and second amplitudes, and generating separate first and second phase tuning signals that are sent to and received by the first and second tunable filters and having values that are a function of the determined difference, and the first and second phase tuning signals causing one or both of the first and second filters to adjust a phase of one or both of the first and second filtered signals as a function of one or both of the first and second phase tuning signals; and wherein the first frequency is greater than 1 GHz.

10. The electronic device of claim 9, wherein the first and second tunable filters are matched filters.

11. The electronic device of claim 9, wherein the filter tuning device comprises a differential envelope comparator and a voltage tuning device, the differential envelope comparator measures the amplitudes of the first filtered signal and the second filtered signal, and the voltage tuning device generates the first and second phase tuning signals in order to tune the first and second tunable filters.

12. The electronic device of claim 9, wherein the filter tuning device comprises an analog-to-digital convertor, a digital signal processor, and a digital-to-analog convertor, the digital signal processor measures the amplitudes of the first filtered signal and the second filtered signal and instructs the digital-to-analog convertor to generate the first and second phase tuning signals having predetermined voltages in order to tune the first and second tunable filters.

13. The electronic device of claim 9, wherein the first frequency is in the range of between 1 and 10 GHz.

14. The electronic device of claim 9, wherein the filter tuning device generates the first and second phase tuning signals responsive to determining that the difference between the first and second amplitudes is greater than .01%.

\* \* \* \* \*